(12) United States Patent
Song et al.

(10) Patent No.: US 11,490,533 B2
(45) Date of Patent: Nov. 1, 2022

(54) MOUNTING FRAME FOR DISK DRIVE

(71) Applicants: Inventec (Pudong) Technology Corporation, Shanghai (CN); INVENTEC CORPORATION, Taipei (TW)

(72) Inventors: Er-Zhen Song, Shanghai (CN); Xiaogang Lu, Shanghai (CN); Xiu-Hua Zhao, Shanghai (CN)

(73) Assignees: INVENTEC (PUDONG) TECHNOLOGY CORPORATION, Shanghai (CN); INVENTEC CORPORATION, Taipei (TW)

( * ) Notice: Subject to any disclaimer, the term of this patent is extended or adjusted under 35 U.S.C. 154(b) by 43 days.

(21) Appl. No.: 17/194,503

(22) Filed: Mar. 8, 2021

(65) Prior Publication Data
US 2022/0232714 A1 Jul. 21, 2022

(30) Foreign Application Priority Data
Jan. 18, 2021 (CN) .......................... 202110062063.X (51) Int. Cl.
*G06F 1/18* (2006.01)
*H05K 5/02* (2006.01)
*F21V 8/00* (2006.01)

(52) U.S. Cl.
CPC ........... *H05K 5/023* (2013.01); *G02B 6/0008* (2013.01); *G06F 1/187* (2013.01)

(58) Field of Classification Search
CPC ........ H05K 5/023; G02B 6/0008; G06F 1/187
See application file for complete search history.

(56) References Cited

U.S. PATENT DOCUMENTS

| 9,958,912 B2 * | 5/2018 | Chen .................... G11B 33/124 |
| 2009/0129009 A1 * | 5/2009 | Zhang .................. G11B 33/124 361/679.34 |

* cited by examiner

*Primary Examiner* — James Wu
*Assistant Examiner* — Hung Q Dang
(74) *Attorney, Agent, or Firm* — Locke Lord LLP; Tim Tingkang Xia, Esq.

(57) ABSTRACT

A mounting frame configured to install disk drive to cage and including frame body, engagement protrusion, fourth plate, first mounting pillar, and second mounting pillar. Frame body includes first to third plates. Engagement protrusion protrudes from third plate. Fourth plate is pivotally connected to a side of the second plate located away from first plate. Fourth plate includes latch hole. Engagement protrusion is removably inserted into latch hole. First to fourth plates together form accommodation space and two openings connected thereto. Accommodation space is configured to accommodate disk drive. First mounting pillar is fixed on first plate and located between first and fourth plates. First mounting pillar is inserted in first mounting hole of disk drive. Second mounting pillar is fixed on fourth plate and located between first and fourth plates. Second mounting pillar is inserted in second mounting hole of disk drive.

9 Claims, 7 Drawing Sheets

MOUNTING FRAME FOR DISK DRIVE

CROSS-REFERENCE TO RELATED APPLICATIONS

This non-provisional application claims priority under 35 U.S.C. § 119(a) on Patent Application No(s). 202110062063.X filed in China, on Jan. 18, 2021, the entire contents of which are hereby incorporated by reference.

BACKGROUND OF THE INVENTION

Technical Field of the Invention

The invention relates to a casing, more particularly to a mounting frame for disk drive.

Description of the Related Art

With the development of techniques for cloud computing, there has been an increasing demand to store and process more and more data. To prevent the removal of the malfunction disk drive from the server from affecting other disk drives and to facilitate the quantity control of the disk drives of the server, the disk drives are respectively installed in in the server by a plurality of frames.

The typical frame requires a specific way for placement of disk drives. In detail, a typical frame for disk drives includes a plurality of plates to form a space therebetween for accommodating the disk drives, but the disk drive has to be at a specific angle for its hole to be correctly aligned with the respective post on the frame, which leads to inconvenience in disk drive installation. Also, this type of frame generally is large in size.

SUMMARY OF THE INVENTION

The invention is to provide a mounting frame for disk drive, enabling a convenient placement of disk drive.

One embodiment of this invention provides a mounting frame configured to install a disk drive to a cage and including a frame body, an engagement protrusion, a fourth plate, a first mounting pillar, and a second mounting pillar. The frame body includes a first plate, a second plate, and a third plate. The second plate and the third plate are respectively connected to two opposite sides of the first plate and are spaced apart from each other. The engagement protrusion protrudes from the third plate. The fourth plate is pivotally connected to a side of the second plate that is located away from the first plate. The fourth plate includes a latch hole. The engagement protrusion is removably inserted into the latch hole. The first plate, the second plate, the third plate, and the fourth plate together form an accommodation space and two openings connected to the accommodation space. The accommodation space is configured to accommodate the disk drive. The first mounting pillar is fixed on the first plate and located between the first plate and the fourth plate. The first mounting pillar is configured to be inserted in a first mounting hole of the disk drive. The second mounting pillar is fixed on the fourth plate and located between the first plate and the fourth plate. The second mounting pillar is configured to be inserted in a second mounting hole of the disk drive.

According to the mounting frame disclosed by the above embodiments, the fourth plate is pivotally connected to the second plate. Thus, the first mounting pillar fixed on the first plate can be mounted in the first mounting hole of the disk drive while the fourth plate is at the opened position, and then fourth plate can be pivoted to the closed position so that the second mounting pillar fixed on the fourth plate is mounted in the second mounting hole of the disk drive, thereby completing the installation of the disk drive. In this way, the disk drive can be mounted in the mounting frame in a convenient manner.

BRIEF DESCRIPTION OF THE DRAWINGS

The present invention will become more fully understood from the detailed description given hereinbelow and the accompanying drawings which are given by way of illustration only and thus are not limitative of the present invention and wherein.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 1:
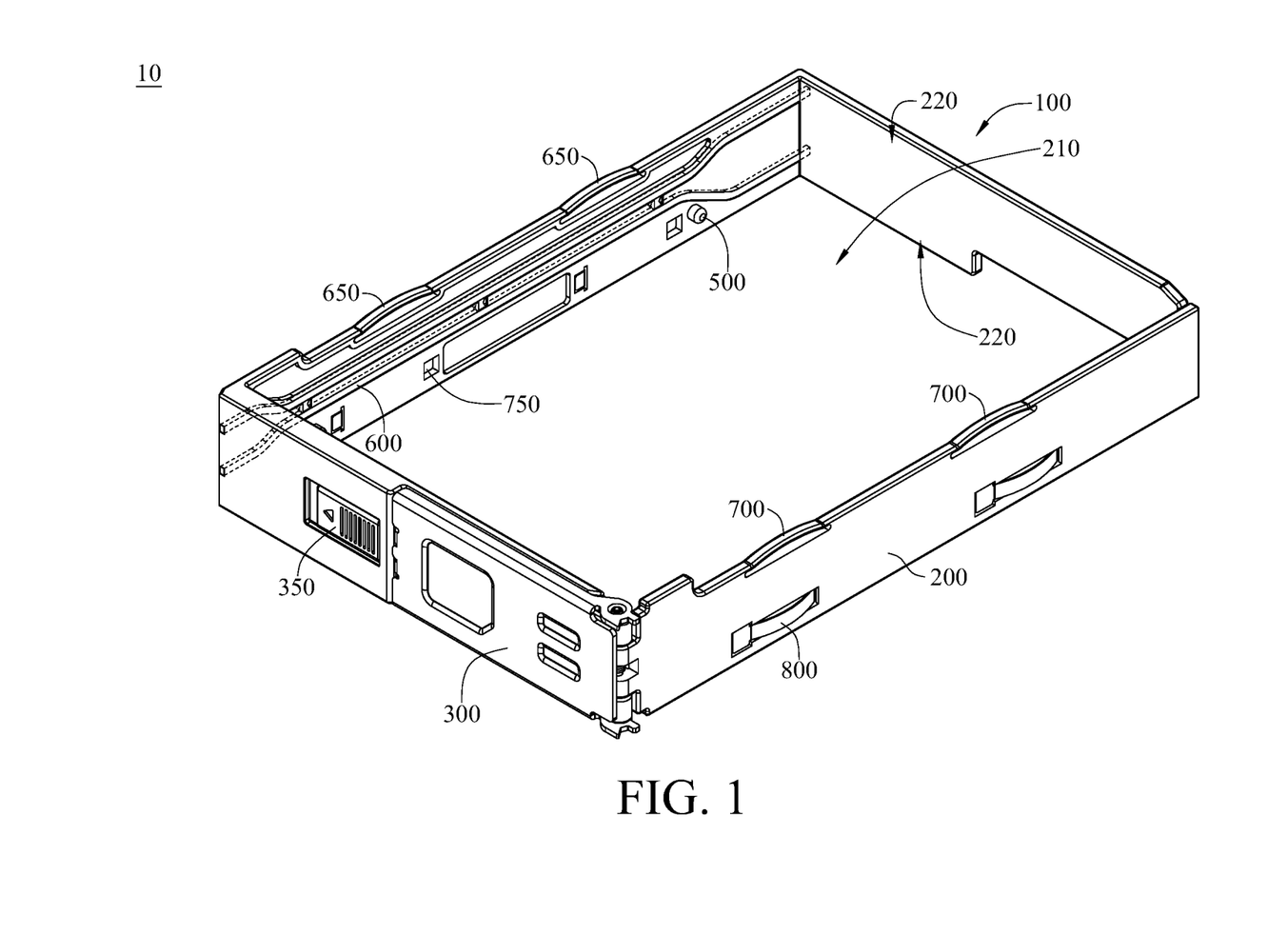
FIG. 1 is a perspective view of a mounting frame for disk drive according to an embodiment of the invention.
Figure 2:
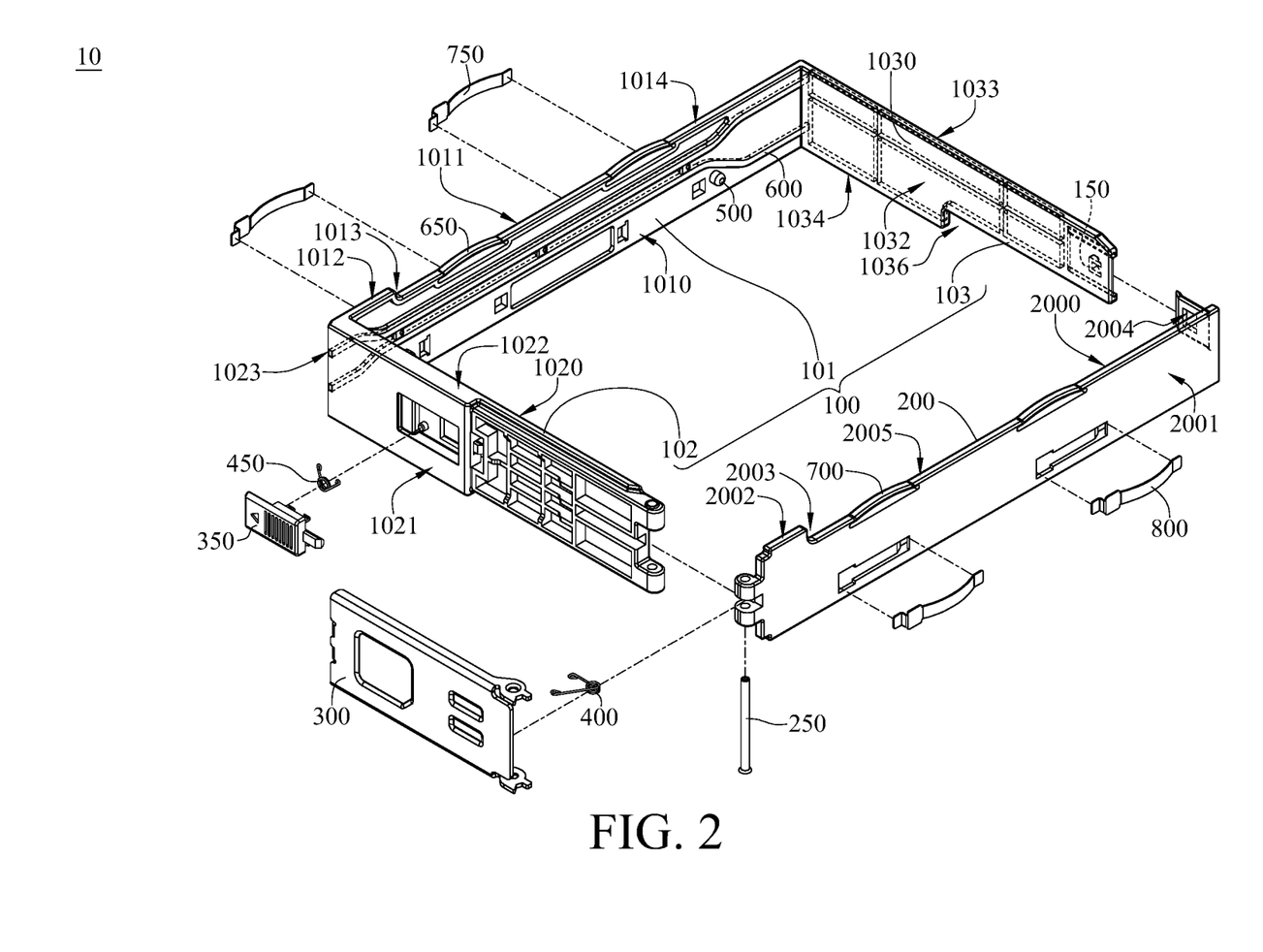
FIG. 2 is an exploded view of the mounting frame in FIG. 1.
Figure 3:
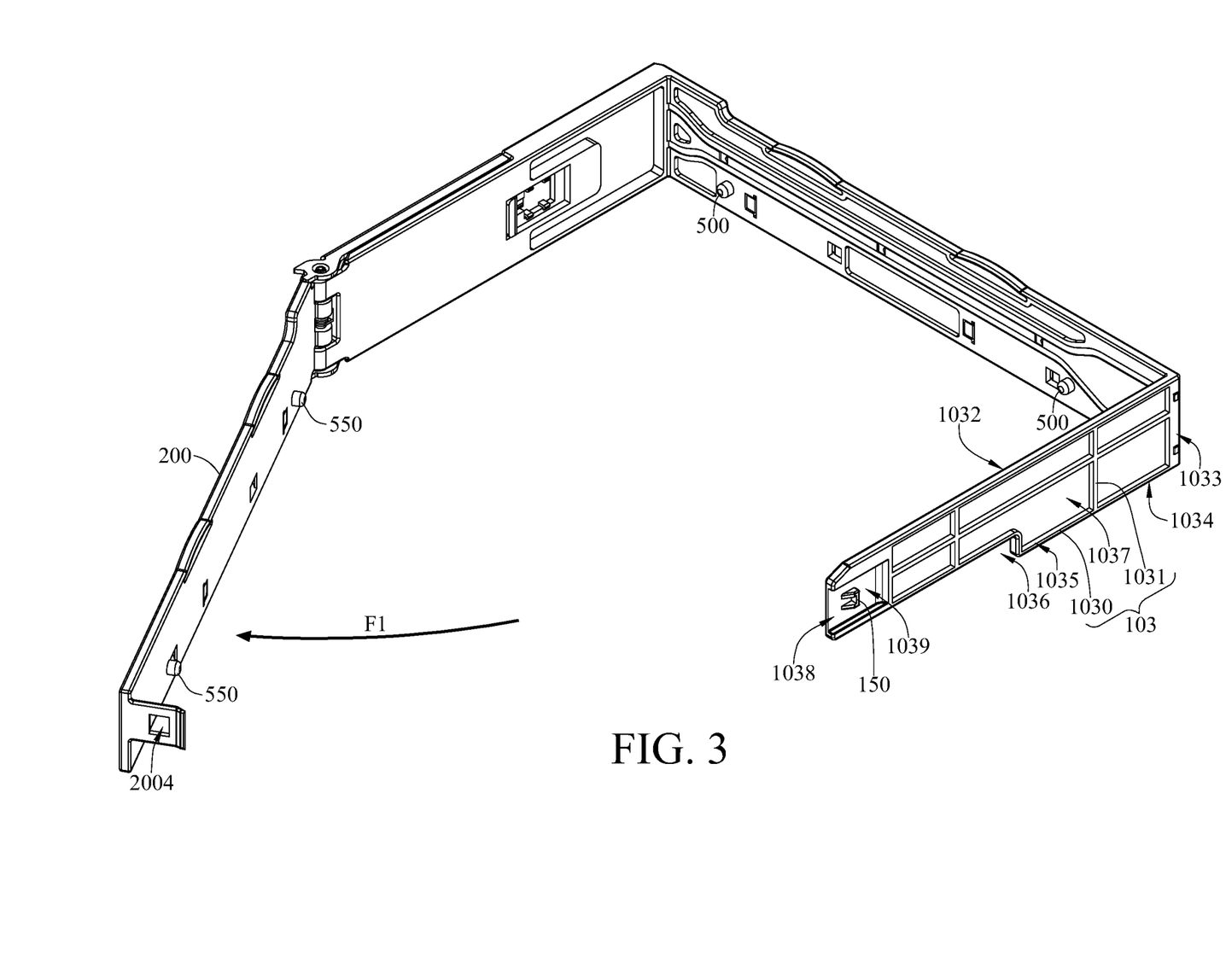
FIG. 3 is a perspective view of the mounting frame in FIG. 1 from another viewing angle and shows that a fourth plate is pivoted relative to a first mounting frame.

Please refer to FIGS. 1, 2 and 3, where FIG. 1 is a perspective view of a mounting frame for disk drive according to an embodiment of the invention, FIG. 2 is an exploded view of the mounting frame in FIG. 1, and FIG. 3 is a perspective view of the mounting frame in FIG. 1 from another viewing angle and shows that a fourth plate is pivoted relative to a first mounting frame.

In this embodiment, a mounting frame 10 for disk drive is provided, and the mounting frame 10 includes a frame body 100, an engagement protrusion 150, a fourth plate 200, a pivot 250, a handle 300, a positioning component 350, a first elastic component 400, a second elastic component 450, two first mounting pillars 500, two second mounting pillars 550, a light guide assembly 600, two first cushioning parts 650, two second cushioning parts 700, two first electrically conductive plates 750, and two second electrically conductive plates 800.

The frame body 100 includes a first plate 101, a second plate 102, and a third plate 103. The second plate 102 and the third plate 103 are respectively connected to two opposite sides of the first plate 101 and are spaced apart from each other. In addition, the second plate 102 and the third plate 103 extend outwards from the first plate 101 along the same direction, that is, the second plate 102 and the third plate 103 are parallel to each other.

The fourth plate 200 is pivotally connected to a side of the second plate 102 that is located away from the first plate 101 via the pivot 250. The first plate 101, the second plate 102, the third plate 103, and the fourth plate 200 together form an accommodation space 210 and two openings 220 located at opposite sides of the accommodation space 210. These two openings 220 are also formed by the first plate 101, the second plate 102, the third plate 103 and the fourth plate 200, such that the mounting frame 10 has a reduced size.

In this embodiment, the first plate 101 includes a first inner surface 1010, a first outer surface 1011, a first side surface 1012, and a first engagement recess 1013. The first inner surface 1010 faces away from the first outer surface 1011 and faces toward the fourth plate 200. The first side surface 1012 is connected to the first inner surface 1010 and the first outer surface 1011. The first engagement recess 1013 penetrates through the first inner surface 1010 and the first outer surface 1011 and is recessed from the first side surface 1012.

In this embodiment, the second plate 102 includes a second inner surface 1020, a second outer surface 1021, and a second side surface 1022. The second inner surface 1020 faces away from the second outer surface 1021 and faces toward the third plate 103. The second side surface 1022 is connected to the second inner surface 1020 and the second outer surface 1021.

In this embodiment, the third plate 103 includes a plate portion 1030 and a plurality of reinforcement protrusions 1031. The plate portion 1030 of the third plate 103 includes a third inner surface 1032, a third outer surface 1033, a third side surface 1034, a plurality of recesses 1035, and a hole 1036.

The third inner surface 1032 faces away from the third outer surface 1033 and faces toward the second plate 102. The third side surface 1034 is connected to the third inner surface 1032 and the third outer surface 1033. The recesses 1035 are recessed from the third outer surface 1033 toward the third inner surface 1032. The reinforcement protrusions 1031 are disposed in the recesses 1035 and separate the recesses 1035 from one another. The reinforcement protrusions 1031 can enhance the structural strength of the third plate 103.

In this embodiment, the recesses 1035 are different in size. In detail, in this embodiment, the recesses 1035 each have a bottom surface 1037, and the bottom surfaces 1037 are different in area. In other embodiments, the third plate 103 may only have two recesses of different sizes while the other recesses are in the same size. Alternatively, in other embodiments, the recesses of the third plate are all in the same size. Alternatively, in other embodiments, the third plate may not have any reinforcement protrusion, and thus this third plate only has one recess.

In this embodiment, the hole 1036 is located on the third side surface 1034 and penetrates through the third inner surface 1032 and the third outer surface 1033. The hole 1036 is spaced apart from the recesses 1035.

In this embodiment, the fourth plate 200 includes a fourth inner surface 2000, a fourth outer surface 2001, a fourth side surface 2002 and a second engagement recess 2003. The fourth inner surface 2000 faces away from the fourth outer surface 2001 and faces toward the first plate 101. The fourth side surface 2002 is connected to the fourth inner surface 2000 and the fourth outer surface 2001. The second engagement recess 2003 is recessed from the fourth side surface 2002 and penetrates through the fourth inner surface 2000 and the fourth outer surface 2001.

In this embodiment, the accommodation space 210 and the openings 220 connected thereto are formed by the first inner surface 1010, the second inner surface 1020, the third inner surface 1032, and the fourth inner surface 2000.

The engagement protrusion 150 protrudes from the third plate 103. Specifically, in this embodiment, the plate portion 1030 of the third plate 103 further includes a recess 1038 recessed toward the third inner surface 1032 from the third outer surface 1033, and the engagement protrusion 150 protrudes from a bottom surface 1039 of the recess 1038. In other embodiments, the third plate may not have the recess 1038 and the engagement protrusion may directly protrude from the flat outer surface of the third plate. The fourth plate 200 further includes a latch hole 2004 spaced apart from the second engagement recess 2003. The engagement protrusion 150 is removably engaged with the latch hole 2004.

In this embodiment, the fourth plate 200 includes a closed position (as shown in FIG. 1) and an opened position (as shown in FIG. 3). As shown in FIG. 1, when the fourth plate 200 is in closed position, the engagement protrusion 150 is engaged with the latch hole 2004 to secure the fourth plate 200 in the closed position.

As shown in FIG. 3, when the engagement protrusion 150 is detached from the latch hole 2004, the fourth plate 200 can be pivoted to the opened position relative to the second plate 102 along an open direction F1.

Figure 4:
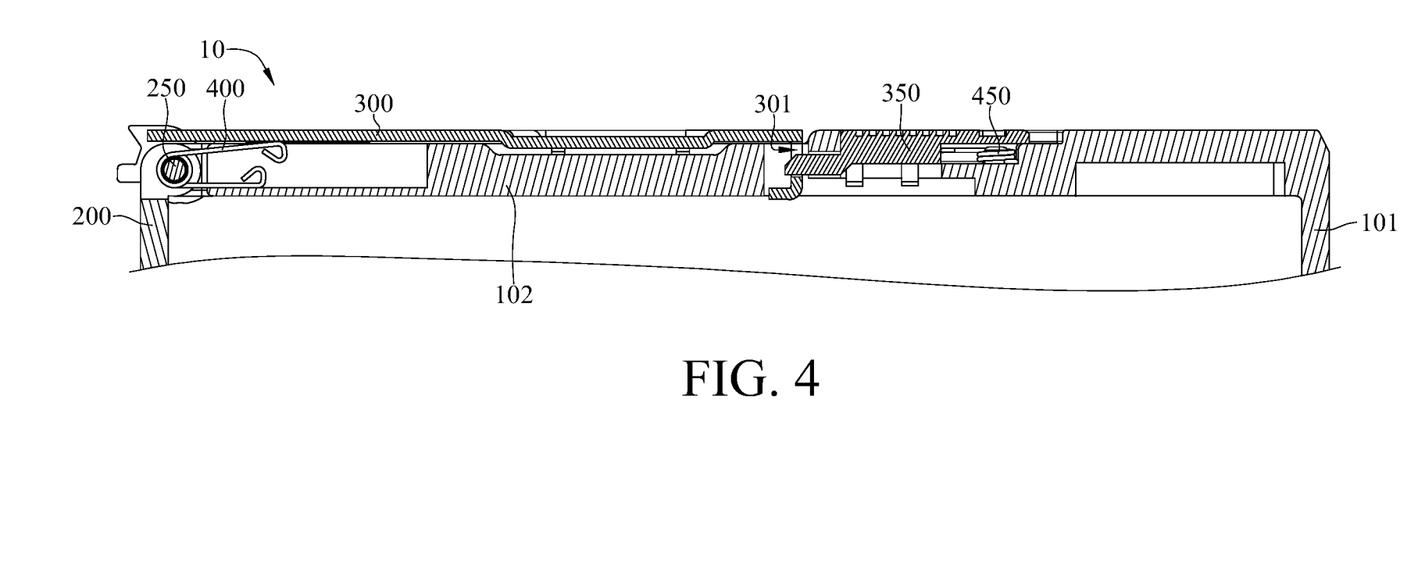
FIG. 4 is a cross-sectional view of the mounting frame in FIG. 1.
Figure 5:
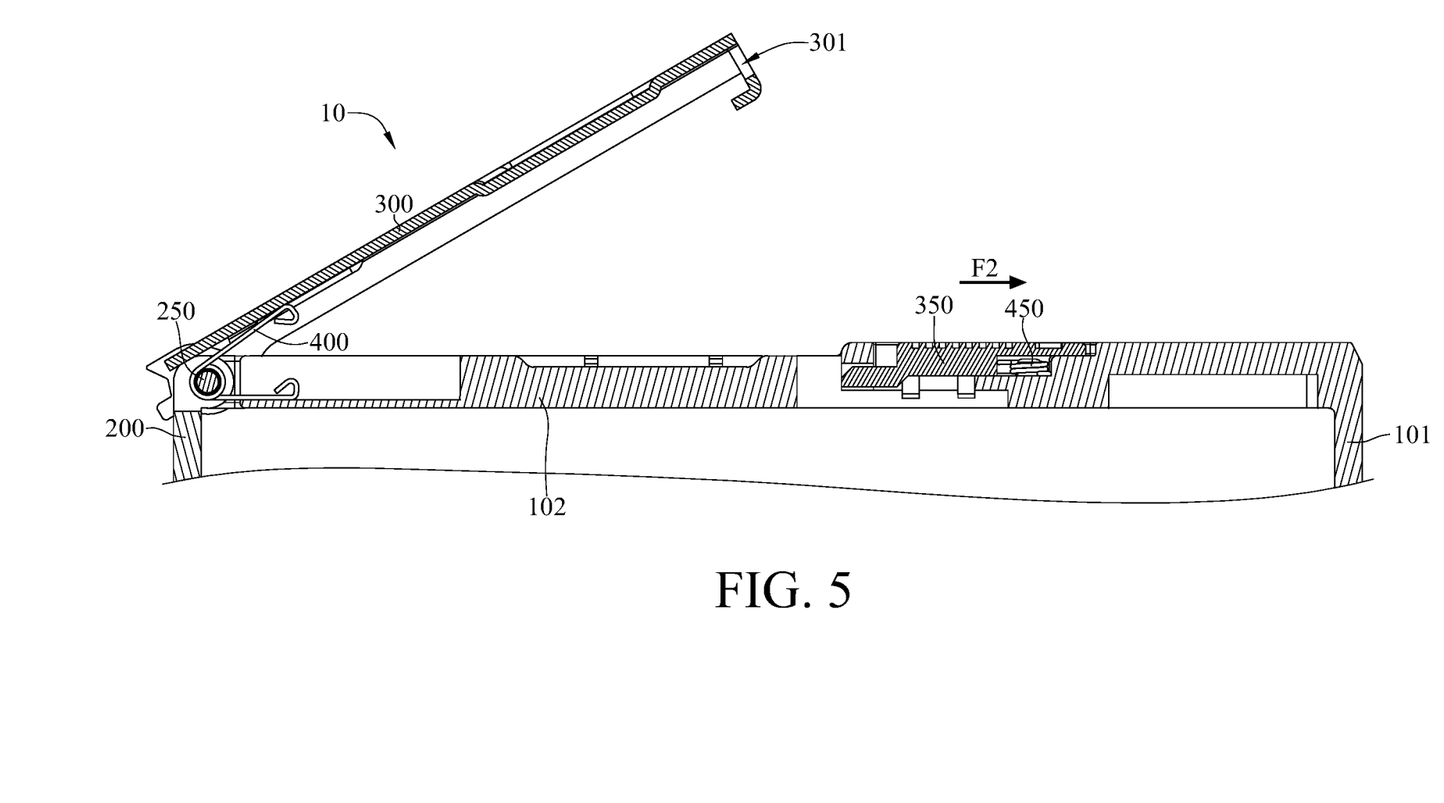
FIG. 5 is a cross-sectional view of the mounting frame in FIG. 1 and shows that a handle is pivoted relative to a second plate.

Please refer to FIGS. 4 and 5. FIG. 4 is a cross-sectional view of the mounting frame in FIG. 1. FIG. 5 is a cross-sectional view of the mounting frame in FIG. 1 and shows that a handle is pivoted relative to a second plate. The handle 300 has a positioning hole 301. The handle 300 is pivotally connected to the side of the second plate 102 that is located away from the first plate 101 via the pivot 250. That is, the handle 300 and the fourth plate 200 both are pivotally connected to the side of the second plate 102 that is located away from the first plate 101 via the pivot 250. The positioning component 350 is movably disposed on the second plate 102 and is detachably positioned in the positioning hole 301 of the handle 300.

Additionally, in this embodiment, the first elastic component 400 and the second elastic component 450 are, for example, torsion springs. Two opposite ends of the first elastic component 400 are respectively fixed to the handle 300 and the second plate 102, such that the first elastic component 400 can restore the handle 300 to its original position. Two opposite ends of the second elastic component 450 are respectively fixed to the positioning component 350 and the second plate 102, such that the second elastic component 450 can restore the positioning component 350 to its original position. In other embodiments, the mounting frame may omit the first elastic component 400 and the second elastic component 450, and the handle 300 and the positioning component 350 are moved manually.

In this embodiment, the handle 300 includes a folded position (as shown in FIG. 4) and an unfolded position (as shown in FIG. 5). As shown in FIG. 4, when the positioning component 350 is engaged with the positioning hole 301 of the handle 300, the compressed second elastic component 450 releases its stored elastic energy to hold the positioning component 350 in the positioning hole 301. Since the positioning component 350 is engaged with the positioning hole 301 of the handle 300, the handle 300 is held in the folded position and the first elastic component 400 is compressed.

As shown in FIG. 5, when the positioning component 350 is pulled along a removal direction F2, the positioning component 350 is moved away from the positioning hole 301 of the handle 300. When the positioning component 350 is removed from the positioning hole 301 of the handle 300, the compressed first elastic component 400 releases its stored elastic energy to move the handle 300 to the unfolded position for user to hold it to move the mounting frame 10.

In other embodiments, the mounting frame may omit the handle 300 and the positioning component 350, in this case, user may move the mounting frame by holding the second plate.

Please refer to FIGS. 1 to 3. The first mounting pillar 500 is fixed to and protrudes inwards from the first inner surface 1010 of the first plate 101 and is located between the first plate 101 and the fourth plate 200. The second mounting pillar 550 is fixed to and protrudes inwards from the fourth inner surface 2000 of the fourth plate 200 and is located between the first plate 101 and the fourth plate 200.

In this embodiment, the second plate 102 includes two light-emitting openings 1023. The two light-emitting openings 1023 are located on the second outer surface 1021. The light guide assembly 600 is fixed on the first inner surface 1010 of the first plate 101 and one end of the light guide assembly 600 is exposed from the two light-emitting openings 1023. The light guide assembly 600 is configured to guide a light emitted from an indicator light to the light-emitting openings 1023. In other embodiments, the mounting frame may omit the light guide assembly 600, in this case, the second plate may also omit the light-emitting openings 1023.

The two first cushioning parts 650 and the first plate 101 are integrally formed as a single piece and is located on a bottom surface 1014 of the first plate 101 forming the first engagement recess 1013. The two second cushioning parts 700 and the fourth plate 200 are integrally formed as a single piece and are located on a bottom surface 2005 of the fourth plate 200 forming the second engagement recess 2003. In other embodiments, the mounting frame may include only one first cushioning part 650 and one second cushioning part 700 or may not include the first cushioning part 650 and the second cushioning part 700.

In this embodiment, the two first electrically conductive plates 750 protrude from a side of the first plate 101 that is located away from the fourth plate 200, and a part of the first electrically conductive plate 750 is located between the first plate 101 and the fourth plate 200. The two second electrically conductive plates 800 protrude from a side of the fourth plate 200 that is located away from the first plate 101, and a part of the second electrically conductive plate 800 is located between the fourth plate 200 and the first plate 101. In other embodiments, the mounting frame may include one first electrically conductive plate 750 and one second electrically conductive plate 800 or may not include the first electrically conductive plate 750 and the second electrically conductive plate 800.

Figure 6:
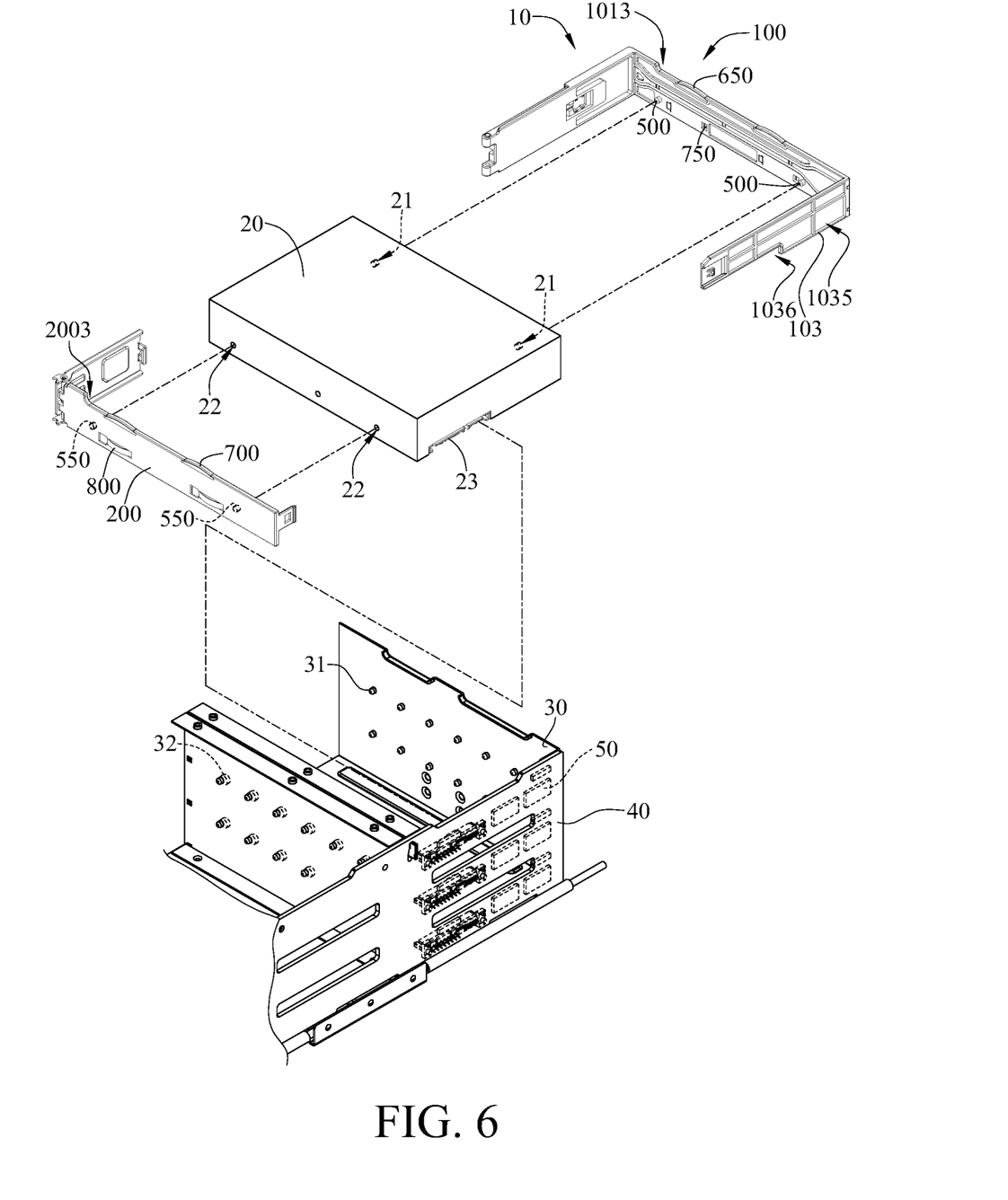
FIG. 6 is an exploded view of the mounting frame in FIG. 1, a disk drive and a cage.
Figure 7:
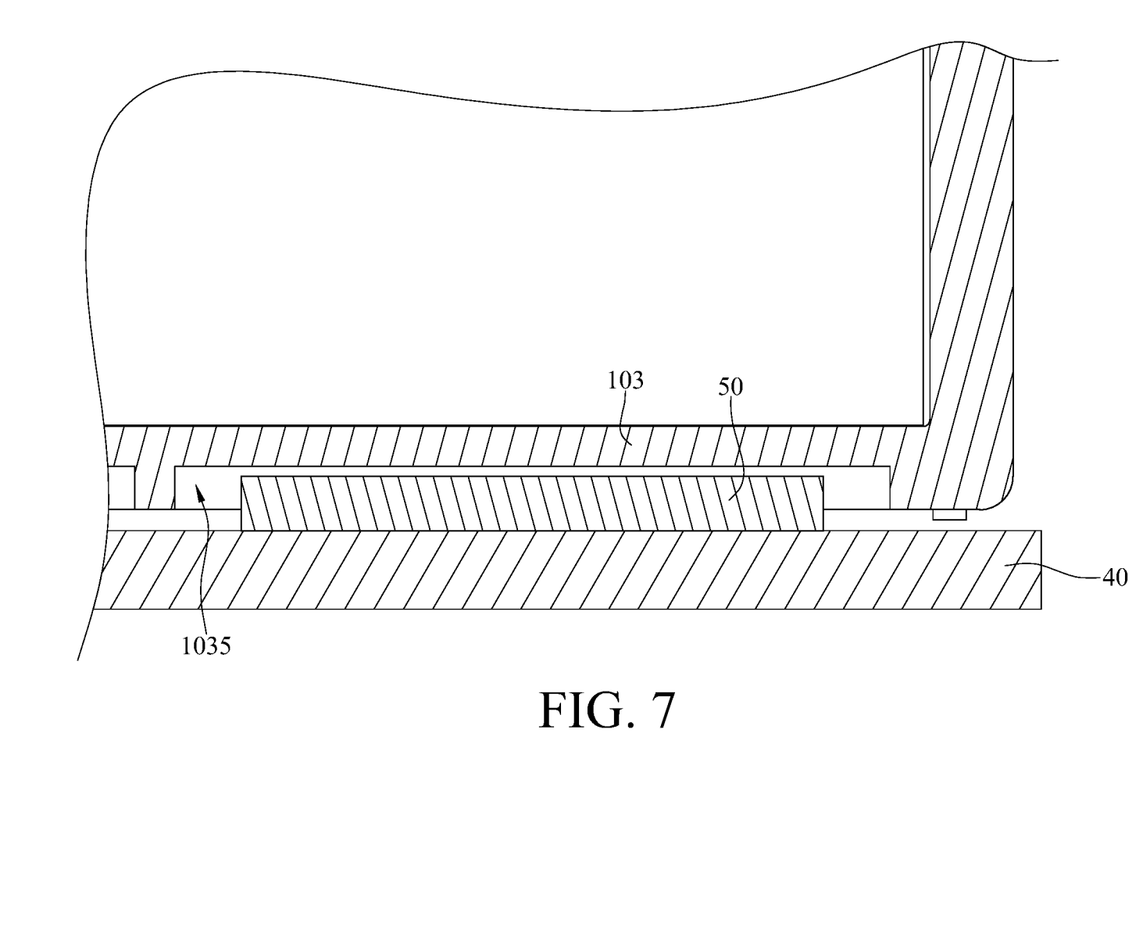
FIG. 7 is a cross-sectional view showing that an electronic component is located in a recession of a third plate of the mounting frame is FIG. 1.

Please refer to FIGS. 6 and 7, where FIG. 6 is an exploded view of the mounting frame in FIG. 1, a disk drive and a cage, and FIG. 7 is a cross-sectional view showing that an electronic component is located in a recess of a third plate of the mounting frame is FIG. 1.

In this embodiment, the mounting frame 10 is configured for the installation of a disk drive 20 to a cage 30, where the cage 30 is, for example a server chassis. In detail, the first mounting pillars 500 are configured to be inserted in two first mounting holes 21 of the disk drive 20, respectively. The two second mounting pillars 550 are configured to be inserted in the two second mounting holes 22 of the disk drive 20, respectively. The hole 1036 is configured for the insertion of a connector 23 of the disk drive 20. The first engagement recess 1013 is configured to be engaged with a plurality of first engagement structures 31 fixed on the cage 30, and the first cushioning part 650 is configured to rest on the first engagement structure 31. The second engagement recess 2003 is configured to be engaged with a plurality of second engagement structures 32 fixed on the cage 30, and the second cushioning part 700 is configured to rest on the second engagement structure 32. The first electrically conductive plate 750 and the second electrically conductive plate 800 are configured to be in contact with the disk drive 20 for grounding. In addition, a back panel 40 is disposed on the cage 30 and is configured to be electrically connected to the disk drive 20 via the connector 23. As shown in FIG. 7, when the disk drive 20 is installed in position in the cage 30 via the mounting frame 10, electronic components 50 disposed on the back panel 40 are located in the recesses 1035 without having physical interference with the third plate 103. In this embodiment, an indicator light of the disk drive 20 is configured to emit a light to show the operation status of the disk drive 20.

In other embodiment, the first plate may not include the first engagement recess 1013 and the fourth plate may not include the second engagement recess 2003. That is, in other embodiments, the mounting frame and the cage may be fixed to each other by screwing but not the engagement of the engagement groove and the engagement structure.

In other embodiments, the third plate may not include the hole 1036 and the connector and the third plate are prevented from being interfered with each other by adjusting the width of the third plate.

In other embodiments, the third plate may not include the recess 1035 and the electronic component is prevented from being interfered with the third plate by adjusting the thickness of the third plate.

According to the mounting frame disclosed by the above embodiments, the fourth plate is pivotally connected to the second plate. Thus, the first mounting pillar fixed on the first plate can be mounted in the first mounting hole of the disk drive while the fourth plate is at the opened position, and then fourth plate can be pivoted to the closed position so that the second mounting pillar fixed on the fourth plate is mounted in the second mounting hole of the disk drive, thereby completing the installation of the disk drive. In this way, the disk drive can be mounted in the mounting frame in a convenient manner.

Furthermore, since the first plate, the second plate, the third plate and the fourth plate form the two openings that are connected to the accommodation space and have small thickness, the total size of the mounting frame can be reduced.

It will be apparent to those skilled in the art that various modifications and variations can be made to the present invention. It is intended that the specification and examples be considered as exemplary embodiments only, with a scope of the invention being indicated by the following claims and their equivalents.

What is claimed is:

1. A mounting frame, configured to install a disk drive to a cage, the mounting frame comprising:
   a frame body, comprising a first plate, a second plate, and a third plate, wherein the second plate and the third plate are respectively connected to two opposite sides of the first plate and are spaced apart from each other;

an engagement protrusion, protruding from the third plate;

a fourth plate, pivotally connected to a side of the second plate that is located away from the first plate, wherein the fourth plate comprises a latch hole, the engagement protrusion is removably inserted into the latch hole, the first plate, the second plate, the third plate, and the fourth plate together form an accommodation space and two openings connected to the accommodation space, and the accommodation space is configured to accommodate the disk drive;

a first mounting pillar, fixed on the first plate and located between the first plate and the fourth plate, wherein the first mounting pillar is configured to be inserted in a first mounting hole of the disk drive; and a second mounting pillar, fixed on the fourth plate and located between the first plate and the fourth plate, wherein the second mounting pillar is configured to be inserted in a second mounting hole of the disk drive;

wherein the mounting frame further comprises a positioning component, a handle and a pivot, the positioning component is movably disposed on the second plate, the handle comprises a positioning hole, the handle and the fourth plate are pivotally connected to a side of the second plate that is located away from the first plate via the pivot, the positioning component is detachably positioned in the positioning hole of the handle.

2. The mounting frame according to claim 1, wherein the third plate comprises an inner surface, an outer surface and at least one recess, the inner surface faces away from the outer surface and faces toward the second plate, the at least one recess is recessed from the outer surface toward the inner surface.

3. The mounting frame according to claim 2, wherein there are a plurality of recesses, the third plate comprises a body and a plurality of reinforcement protrusions, the inner surface, the outer surface and the recess are located on the body, the plurality of reinforcement protrusions are disposed in the plurality of recesses to separate the plurality of recesses from each other.

4. The mounting frame according to claim 3, wherein at least two of the plurality of recesses are different in size.

5. The mounting frame according to claim 2, wherein the third plate further comprises a side surface and a hole, the side surface is connected to the inner surface and the outer surface, the hole is located on the side surface and penetrates through the inner surface and the outer surface, the hole is spaced apart from the at least one recess, the hole is configured for an insertion of a connector of the disk drive.

6. The mounting frame according to claim 1, further comprising a first elastic component and a second elastic component, wherein two opposite ends of the first elastic component are fixed to the handle and the second plate, respectively, two opposite ends of the second elastic component are fixed to the positioning component and the second plate, respectively.

7. The mounting frame according to claim 1, further comprising a light guide assembly, wherein the second plate comprises two light-emitting openings, the light guide assembly is fixed on the first plate, and an end of the light guide assembly is exposed from the two light-emitting openings.

8. The mounting frame according to claim 1, wherein the first plate comprises a first inner surface, a first outer surface, a first side surface and a first engagement recess, the first inner surface faces away from the first outer surface and faces toward the fourth plate, the first side surface is connected to the first inner surface and the first outer surface, the first engagement recess penetrates through the first inner surface and the first outer surface and is recessed from the first side surface, the first engagement recess is configured to be engaged with a first engagement structure fixed on the cage, the fourth plate comprises a second inner surface, a second outer surface, a second side surface and a second engagement recess, the second inner surface faces away from the second outer surface and faces toward the first plate, the second side surface is connected to the second inner surface and the second outer surface, the second engagement recess penetrates through the second inner surface and the second outer surface and is recessed from the second side surface, the second engagement recess is configured to be engaged with a second engagement structure fixed on the cage.

9. The mounting frame according to claim 8, further comprising a first cushioning part and a second cushioning part, the first cushioning part and the first plate are integrally formed as a single piece, the first cushioning part is located on a first bottom surface of the first engagement recess, the second cushioning part and the fourth plate are integrally formed as a single piece, the second cushioning part is located on a second bottom surface of the second engagement recess.

* * * * *